United States Patent
Li et al.

(10) Patent No.: US 8,466,003 B2
(45) Date of Patent: Jun. 18, 2013

(54) METHODS OF BUILDING CRYSTALLINE SILICON SOLAR CELLS FOR USE IN COMBINATORIAL SCREENING

(75) Inventors: Jian Li, Fremont, CA (US); James Craig Hunter, Los Gatos, CA (US); Nikhil Kalyankar, Hayward, CA (US); Nitin Kumar, Fremont, CA (US); Minh Anh Anh Nguyen, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/442,171

(22) Filed: Apr. 9, 2012

(65) Prior Publication Data

US 2012/0196397 A1    Aug. 2, 2012

Related U.S. Application Data

(63) Continuation of application No. 12/886,533, filed on Sep. 20, 2010.

(60) Provisional application No. 61/244,052, filed on Sep. 20, 2009.

(51) Int. Cl.
*H01L 21/00* (2006.01)

(52) U.S. Cl.
USPC ............. 438/98; 438/260; 438/665; 438/753; 257/184; 257/436; 257/E31.124; 257/E31.012; 257/E27.126

(58) Field of Classification Search
USPC .................. 136/255, 256; 257/184, 431, 436, 257/466, 739, E31.124, E31.13, E27.124, 257/E27.125, E27.126, E21.012, E21.13; 438/57, 71, 87, 98, 260, 665, 753, 795, 913, 438/964, 965
See application file for complete search history.

(56) References Cited

U.S. PATENT DOCUMENTS

| | | | | |
|---|---|---|---|---|
| 4,322,571 A | * | 3/1982 | Stanbery | 136/255 |
| 6,127,623 A | * | 10/2000 | Nakamura et al. | 136/256 |

* cited by examiner

*Primary Examiner* — William D Coleman
*Assistant Examiner* — Su Kim

(57) ABSTRACT

Embodiments of the current invention describe methods of forming different types of crystalline silicon based solar cells that can be combinatorially varied and evaluated. Examples of these different types of solar cells include front and back contact silicon based solar cells, all-back contact solar cells and selective emitter solar cells. These methodologies all incorporate the formation of site-isolated regions using a combinatorial processing tool and the use of these site-isolated regions to form the solar cell area. Therefore, multiple solar cells may be rapidly formed on a single crystalline silicon substrate for use in combinatorial methodologies. Any of the individual processes of the methods described may be varied combinatorially to test varied process conditions or materials.

16 Claims, 14 Drawing Sheets

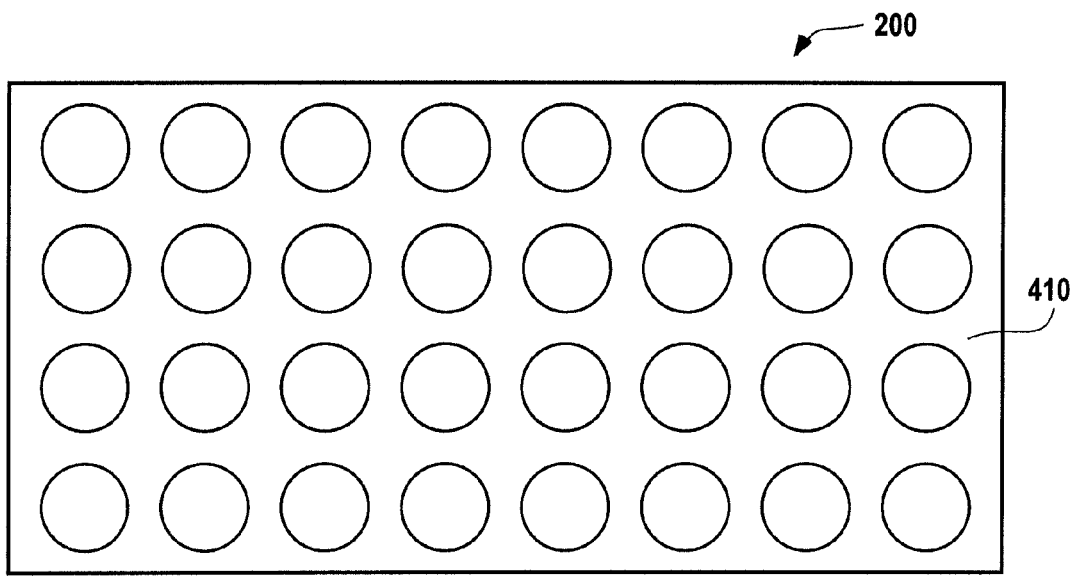
Figure 4C  Backside Passivation
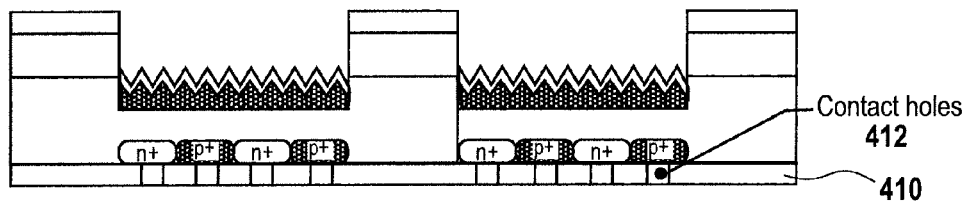
Figure 4D
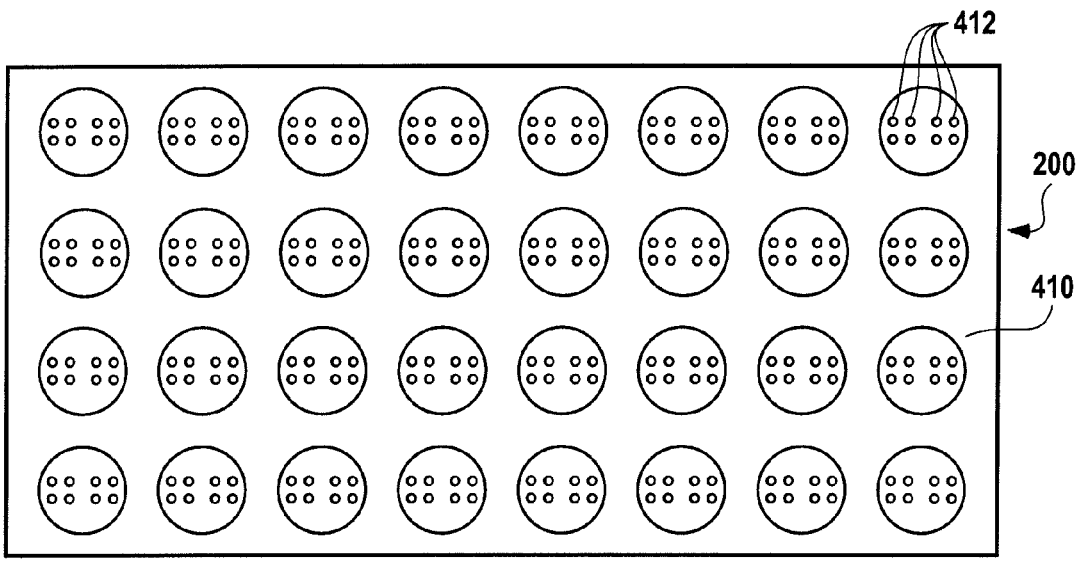
Figure 4E  Etch holes through the passivation layer for contact

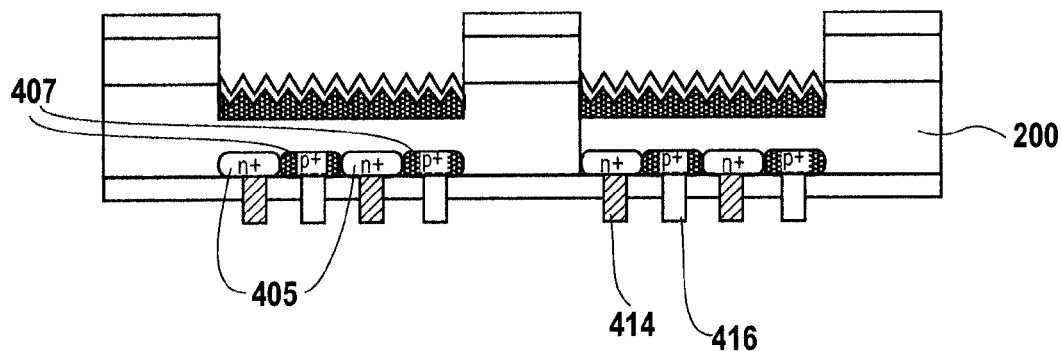
Figure 4F
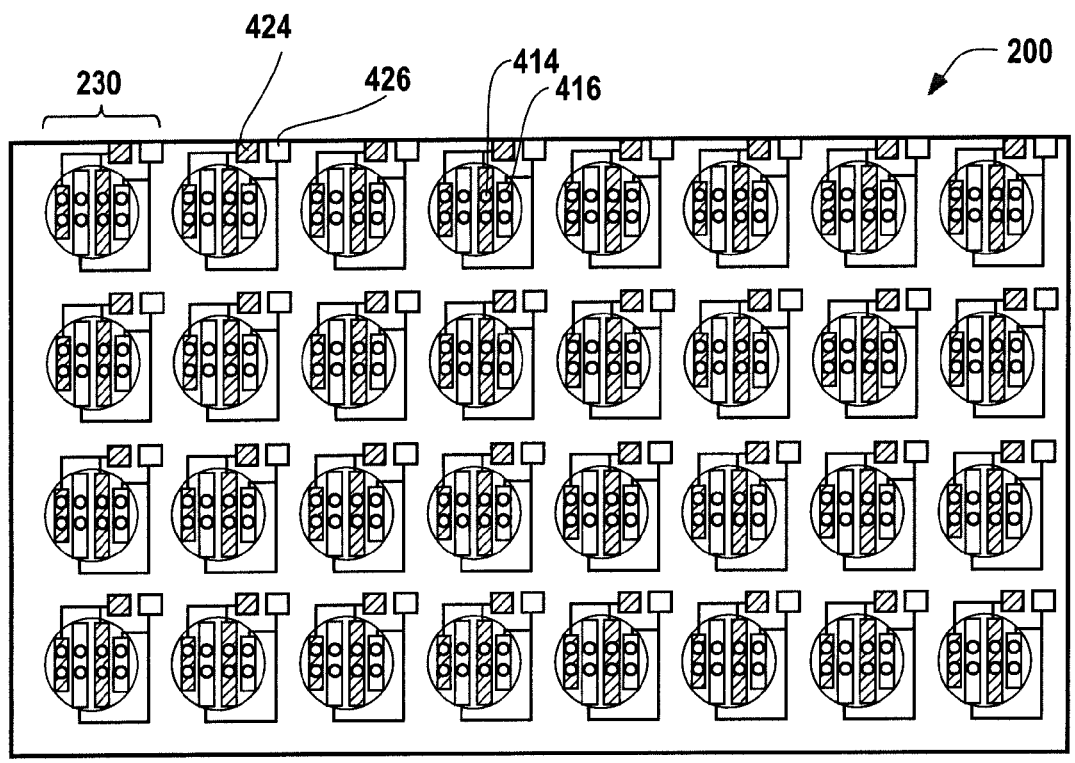
Figure 4G    Backside metallization

US 8,466,003 B2

METHODS OF BUILDING CRYSTALLINE SILICON SOLAR CELLS FOR USE IN COMBINATORIAL SCREENING

CROSS-REFERENCE TO RELATED APPLICATION

This application is a Continuation Application and claims priority to U.S. application Ser. No. 12/886,533 filed on Sep. 20, 2010, which claims priority to U.S. Provisional Application Ser. No. 61/244,052 filed on Sep. 20, 2009, both of which are herein incorporated by reference for all purposes.

FIELD OF THE INVENTION

The present invention relates generally to crystalline silicon solar cell processing. More specifically, methods of forming crystalline silicon solar cell test substrates for use in combinatorial methodologies are described.

BACKGROUND OF THE INVENTION

Combinatorial processing has been used to evaluate materials, processes, and devices formed in semiconductor processing as well as other industries such as batteries, catalysts, pharmaceuticals, and biotechnology. Significant efforts to apply combinatorial processing to solar applications have not been made. In particular, the development of solar cell test substrates for the combinatorial evaluation of silicon-based solar cells has not been done.

Some exemplary solar processing operations for the formation of silicon-based solar cells include operations for adding (depositions) and removing layers (etching or texturing), defining features, preparing layers (e.g., cleans or surface treatments), doping, etc. Improvements, whether in materials, unit processes, or process sequences, are continually being sought for the solar processes. However, solar companies conduct research and development (R&D) on full substrate processing. This approach has resulted in escalating R&D costs and the inability to conduct extensive experimentation in a timely and cost effective manner.

BRIEF DESCRIPTION OF THE DRAWINGS

Various embodiments of the invention are disclosed in the following detailed description and the accompanying drawings:

FIGS. 4A-4G illustrate an process for forming all-back contact crystalline silicon solar cells;

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The process of forming solar cell test substrates to combinatorially test materials, processes, and devices is described herein. Combinatorial processing enables multiple experiments to be performed on a single substrate and the rapid evaluation of solar cell processing operations and solar cell materials. The solar cell test substrates are designed to run the different combinatorial processes either in parallel, serial or some combination of the two. Embodiments of the current invention describe methods of forming different types of crystalline silicon based solar cells that can be combinatorially varied and evaluated. Examples of these different types of solar cells include front and back contact silicon based solar cells, all-back contact solar cells, and selective emitter solar cells. These methodologies all incorporate the formation of site-isolated regions using at least one combinatorial processing tool and the use of these site-isolated regions to form the solar cell area. Therefore, multiple solar cells may be rapidly formed on a single crystalline silicon substrate for use in combinatorial methodologies. Any of the individual processes, process conditions, or materials of the methods described may be varied combinatorially to test the effect of the variation on a solar cell.

Figure 1:
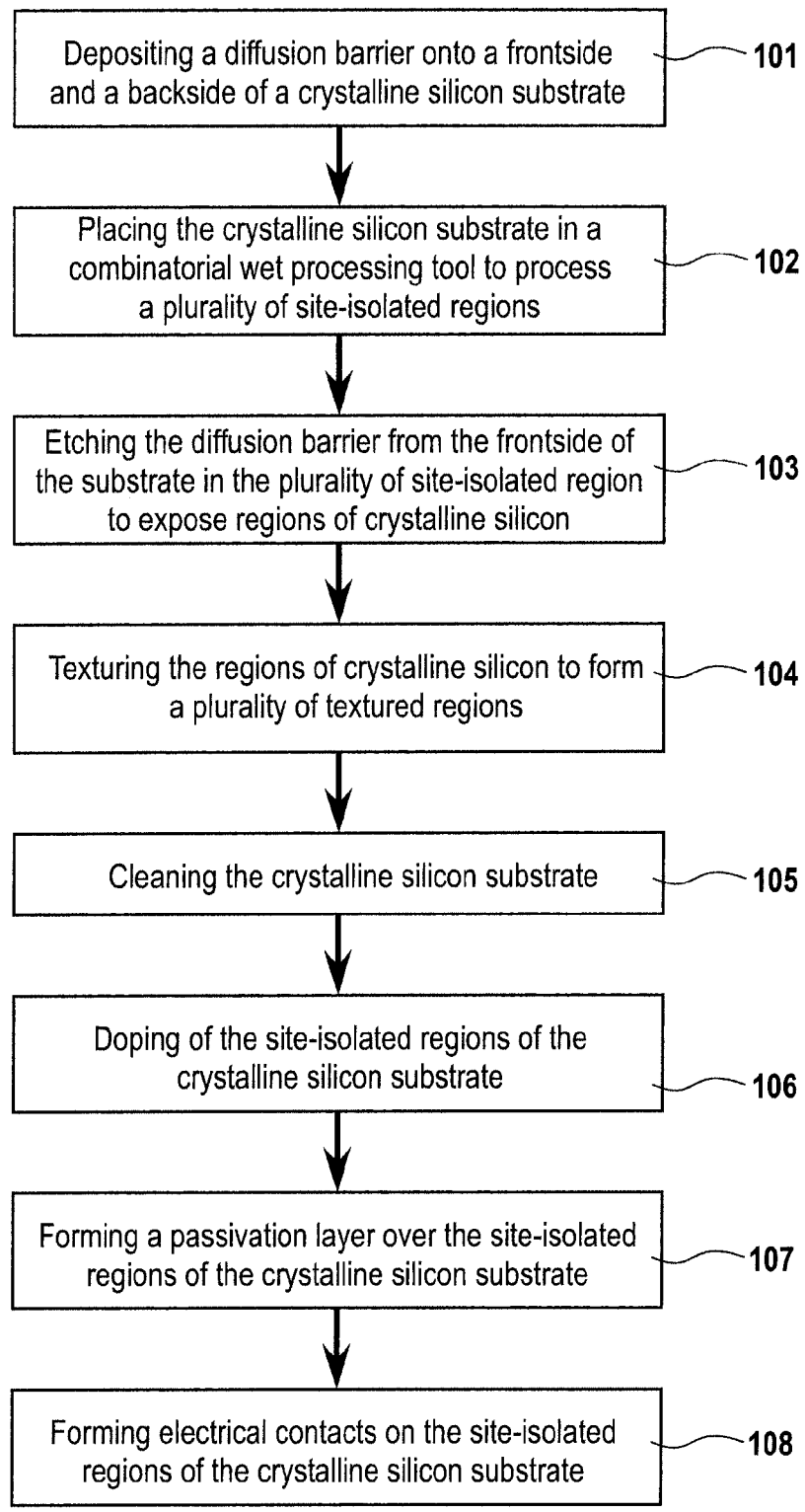
FIG. 1 is a flowchart describing a process for forming a crystalline silicon solar cell substrate according to various embodiments.

FIG. 1 is a flowchart illustrating a workflow methodology for the formation of multiple solar cells on a single crystalline silicon substrate. This flowchart outlines the processes that may be used to form a variety of different types of crystalline silicon based solar cells. The processes outlined in this flowchart may be used to form front contact crystalline silicon based solar cells, all-back contact solar cells, and selective emitter solar cells.

Figure 2A:
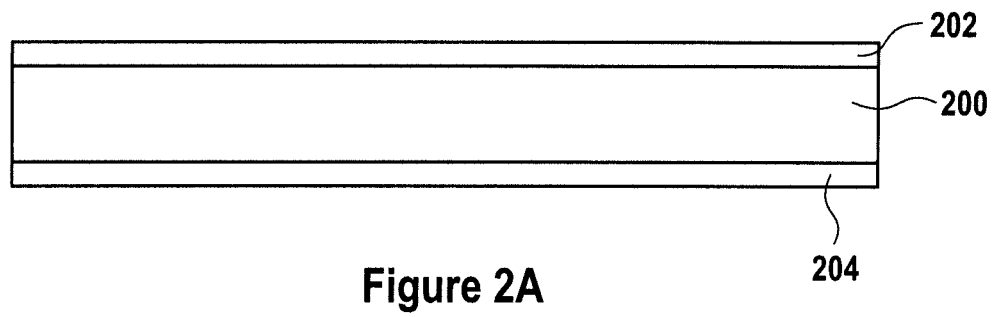
FIGS. 2A-2P illustrate the process for forming the "conventional" crystalline silicon solar cell test substrate according to one embodiment.
Figure 2B:
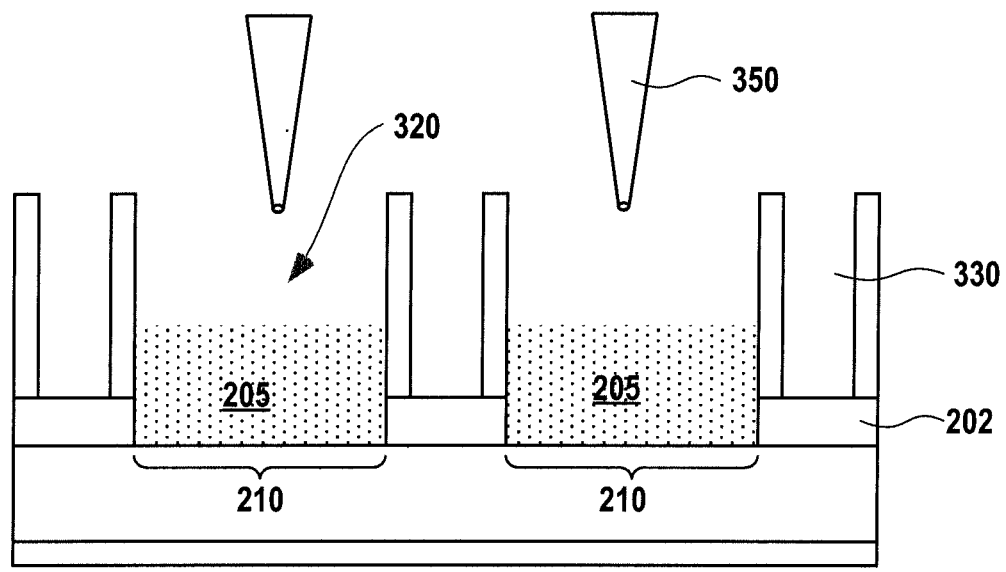
Figure 2C:
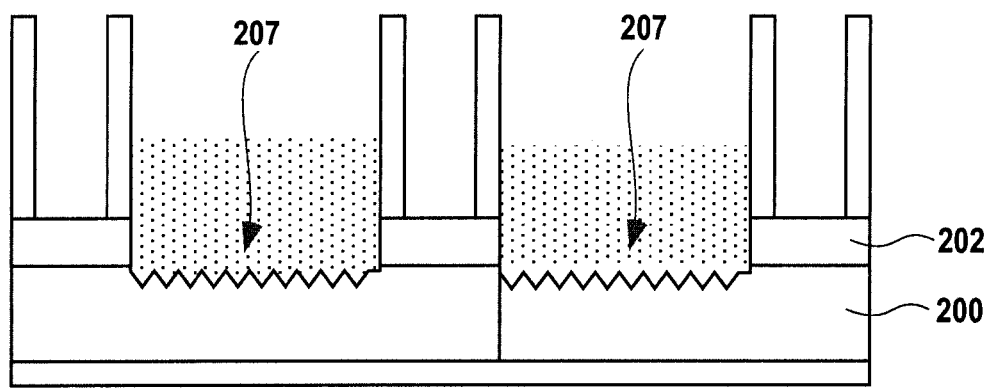
Figure 2D:
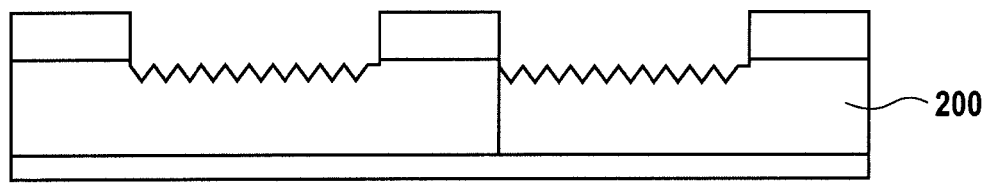
Figure 2E:
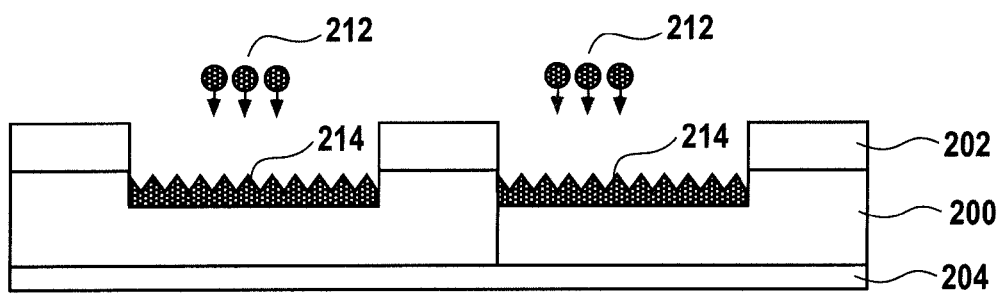
Figure 2F:
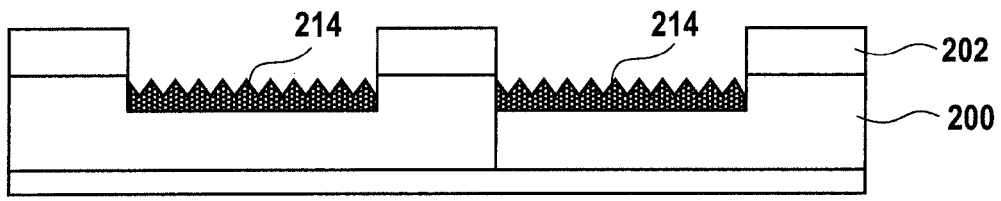
Figure 2G:
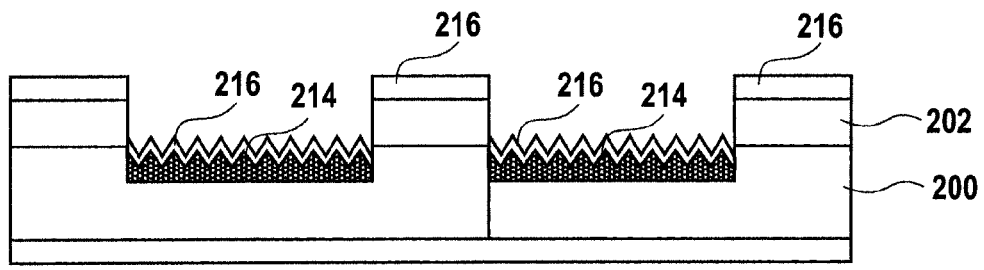
Figure 2H:
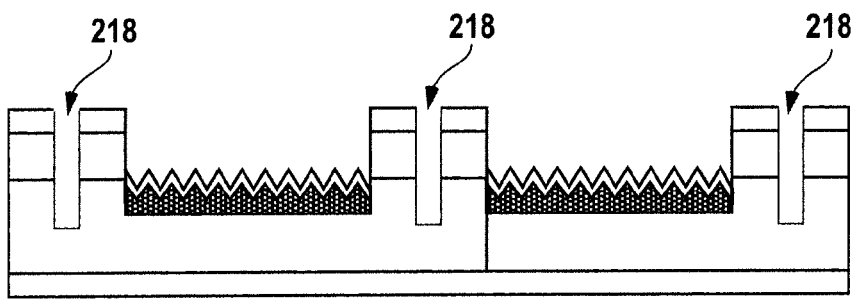
Figure 2I:
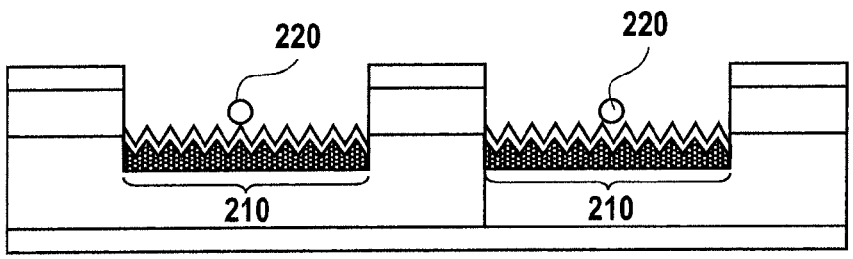
Figure 2J:
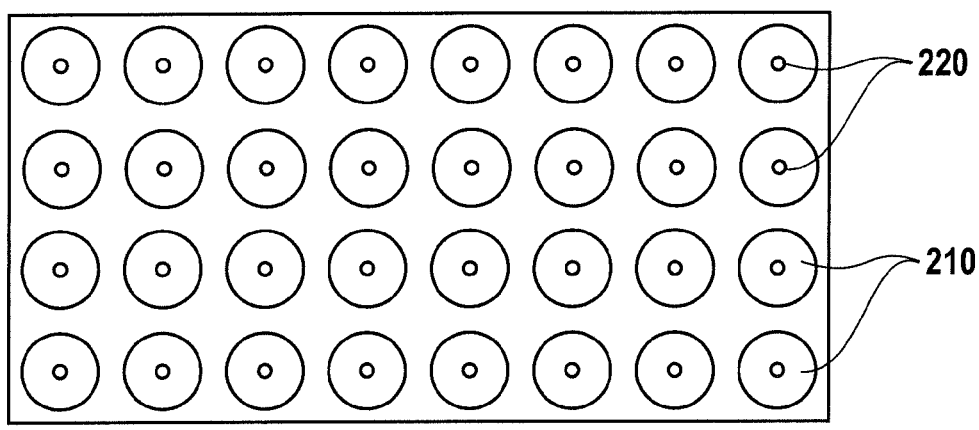
Figure 2K:
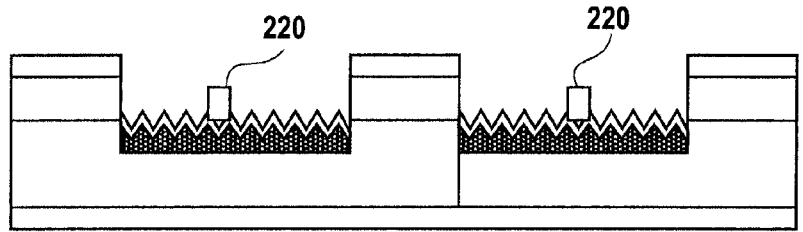
Figure 2L:
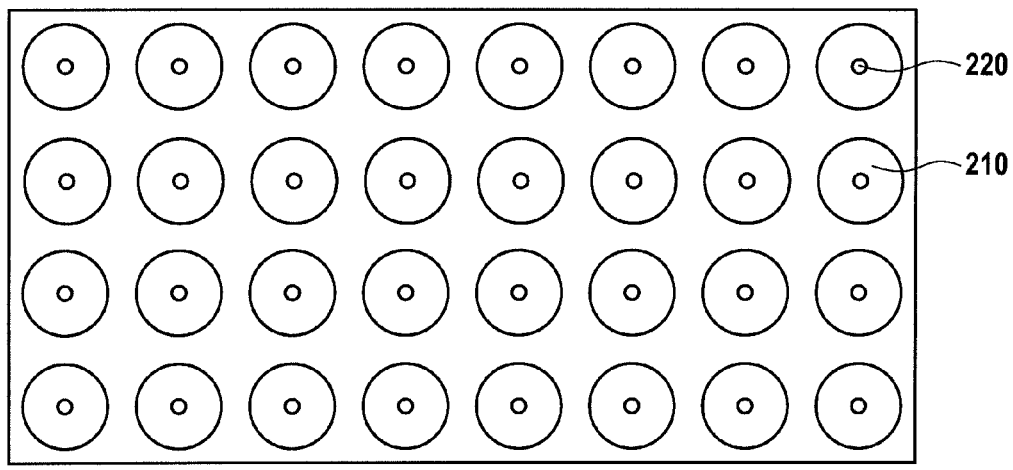
Figure 2M:
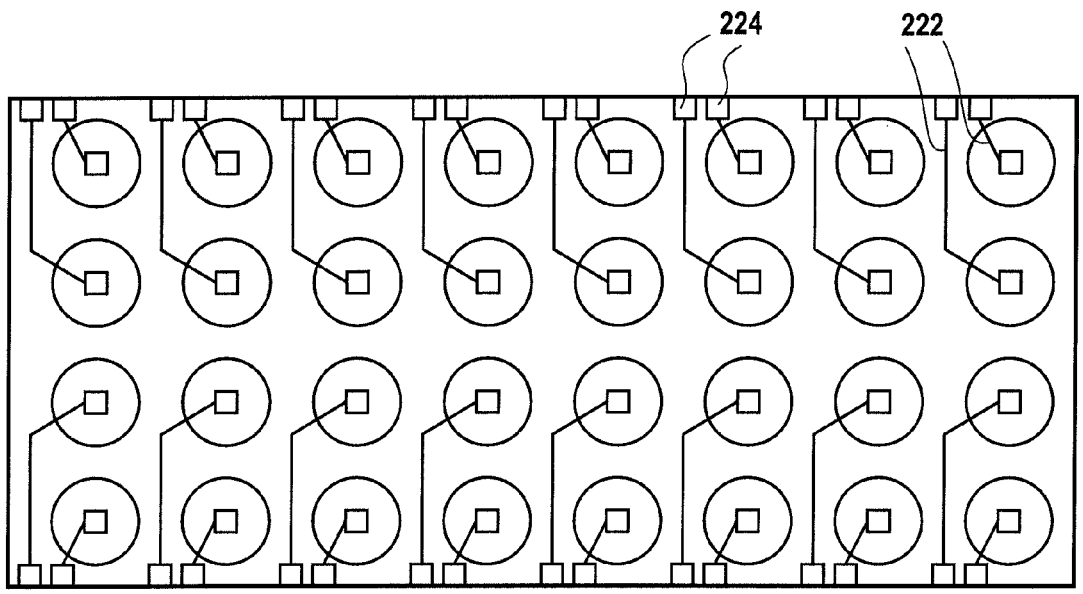
Figure 2N:
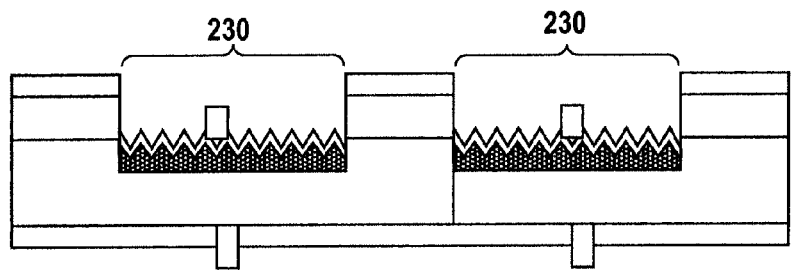
Figure 2O:
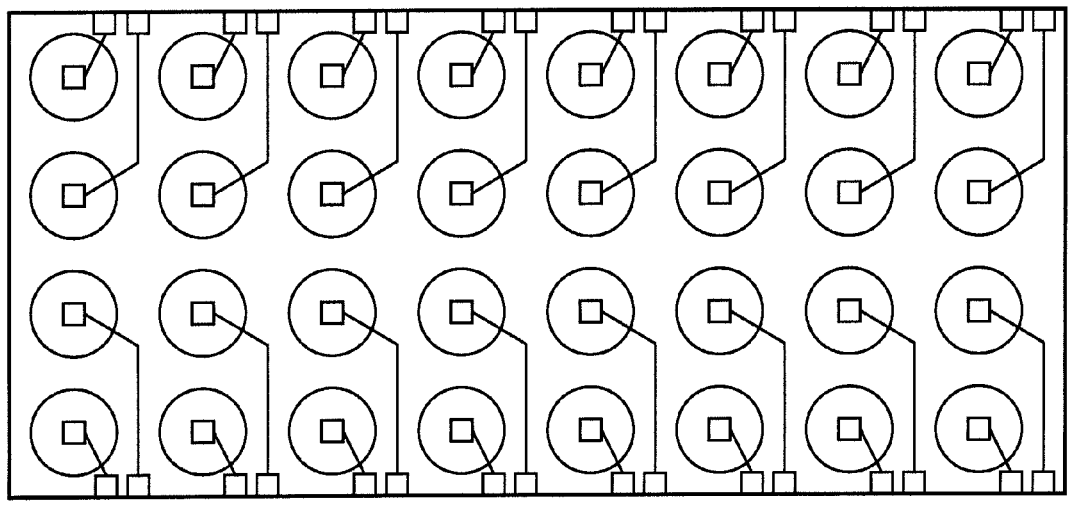
Figure 2P:
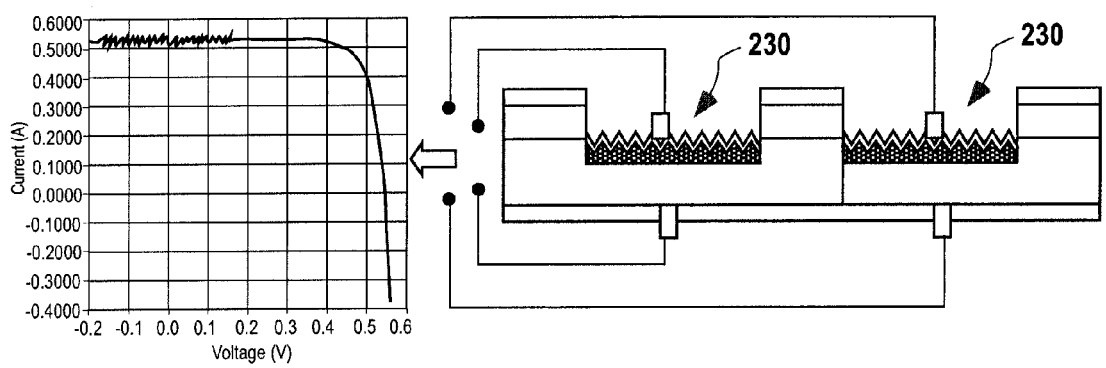

In FIGS. 2A-2P a methodology for forming a plurality of conventional crystalline silicon based solar cells on a single crystalline silicon substrate 200 is described with reference to the flowchart in FIG. 1. The crystalline silicon substrate may be a monocrystalline or multicrystalline substrate having dimensions of either 156 mm×156 mm or 125 mm×125 mm. Substrates having these dimensions are common in the solar industry and would be compatible for use with many standard solar substrate processing tools. Using substrates having these dimensions for combinatorial development of solar cells may allow for the compatibility of the substrates with manufacturing scale tools. As such, substrates may be taken in or out of a solar cell manufacturing line for combinatorial processing.

At block 101 of FIG. 1, a diffusion barrier 202 is deposited on the frontside of the crystalline silicon substrate 200 and a diffusion barrier 204 is deposited on the backside of the crystalline silicon substrate 200. The material used for the diffusion barriers 202 and 204 may be any material that can prevent the diffusion of dopants into the crystalline silicon substrate 200 and can withstand solar cell processing conditions, such as temperatures of up to 950° C. For example, the diffusion barrier could be materials such as silicon nitride ($SiN_x$) or silicon dioxide ($SiO_2$). The diffusion barrier material may be deposited by PECVD, LPCVD, or PVD. A silicon dioxide diffusion barrier may be thermally grown. Additionally, the diffusion barrier material may be deposited by a sol-gel method. The frontside diffusion barrier 202 and the backside diffusion barrier 204 may be deposited at different times or at the same time. The diffusion barriers are deposited to a thickness sufficient to prevent the diffusion of the subsequently diffused dopants from reaching the crystalline silicon substrate. In one embodiment, the thickness of the diffusion barriers 202 and 204 is approximately 200 nm of silicon nitride deposited on each side of the substrate 200 by PVD or CVD.

Figure 3A:
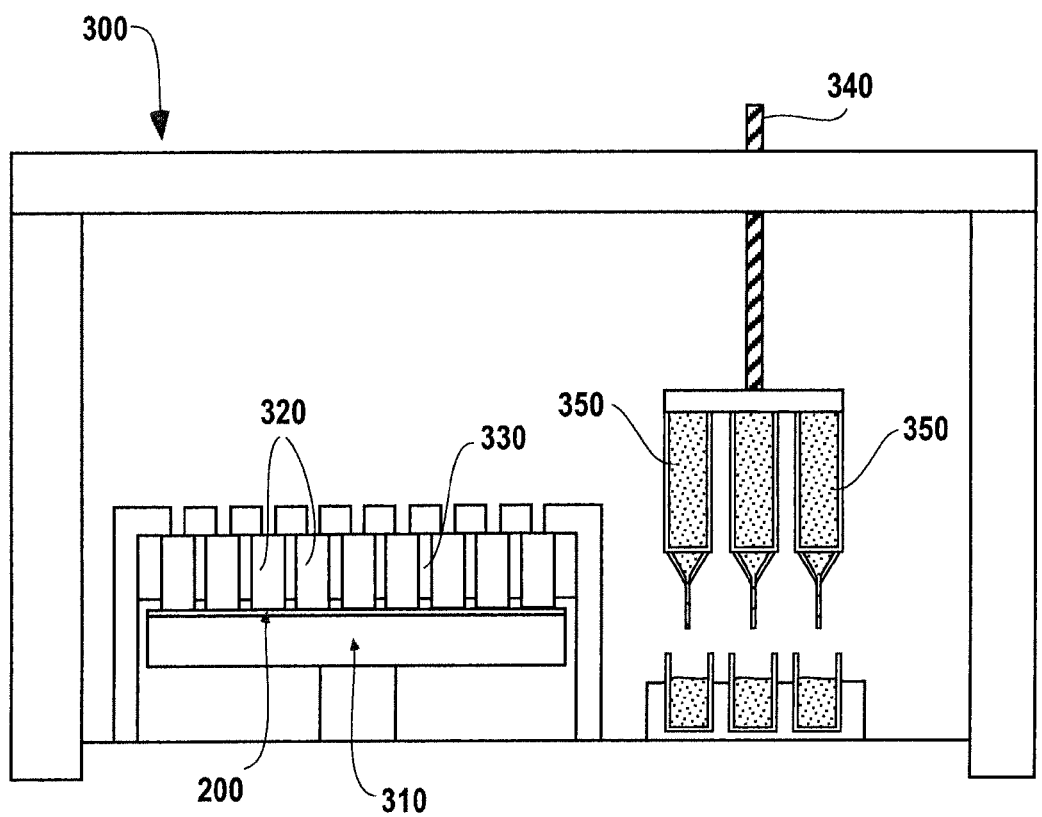
FIG. 3A illustrates an example of a combinatorial wet processing tool.
Figure 3B:
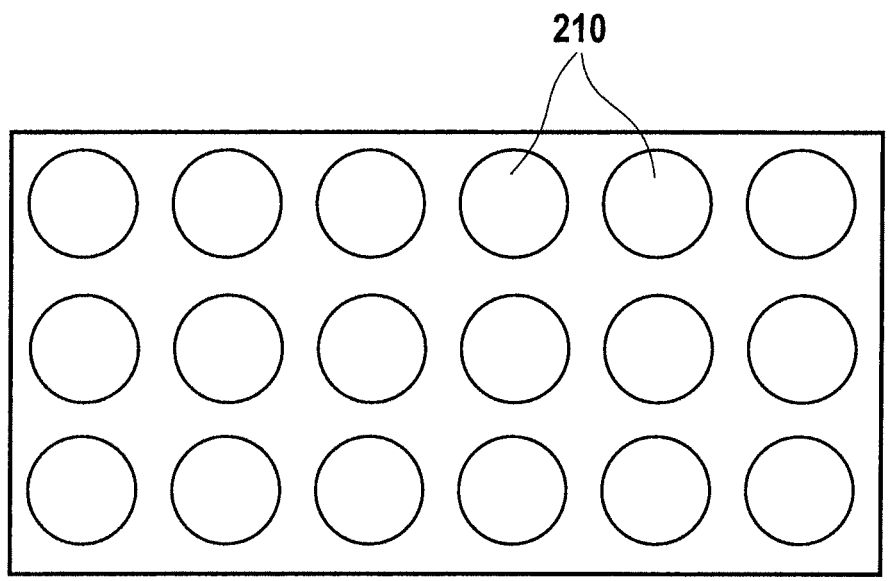
FIG. 3B illustrates an example of a substrate having site-isolated regions formed by a combinatorial wet processing tool, the areas within the site-isolated regions defining the area of the solar cells.

At block 102 of the flowchart in FIG. 1, the crystalline silicon substrate 200 is placed in a combinatorial wet processing tool to process a plurality of site-isolated regions on the substrate 200. FIG. 3A illustrates an example of a combinatorial wet processing tool 300. In this example, the substrate 200 is placed on the pedestal 310 which holds the substrate 200 under the site-isolated reactors 320 that are separated from one another by sidewalls 330. FIG. 3B illustrates an example of a top-down view of the substrate with the site-isolated regions 210 that are created by the sidewalls 330 of the site-isolated reactors 320. The site-isolated regions 210 define the areas of what will ultimately be individual solar cells that may be combinatorially evaluated. The combinatorial wet processing tool 300 of FIG. 3A includes a dispense arm 340 holding multiple dispensers 350 that are used to dispense liquids into each of the reactors 320. The multiple dispensers 350 may hold varied processing liquids or liquids that are the same. FIG. 3A represents one embodiment of a wet processing tool, but alternate versions may also be used. For example, the dispense lines as well as evacuation lines and gas lines may be integrated into each of the reactors 320.

At block 103 of the flowchart in FIG. 1, the diffusion barrier is etched from the frontside of the substrate in the plurality of site-isolated regions to expose regions of crystalline silicon. FIG. 2B illustrates a simplified side view of two reactors 320 having sidewalls 330 and dispensers 350. The dispensers may dispense an etchant 205 onto the surface of the substrate 300 within the site-isolated regions 210 to etch the frontside diffusion barrier 202. The etchant 205 selected may be HF or $H_2PO_3$, or any etchant that will only etch the frontside diffusion barrier 202 material and not the crystalline silicon substrate 200. The etchant 205 is at a concentration and temperature sufficient to etch the area within the site-isolated regions 210 in an efficient amount of time and to etch away only the diffusion barrier material 202 and not the silicon substrate 200. The etchant 205 may be combinatorially varied. The area etched within the site-isolated regions 210 defines the area that will ultimately form the individual solar cells on the substrate 200.

At block 104 of the flowchart of FIG. 1, the site-isolated regions 210 of the exposed crystalline silicon substrate 200 are textured to form a plurality of site-isolated textured silicon regions having a textured surface 207. The frontside diffusion barrier as etched serves as an etch mask for the texturing process at block 104. The regions 210 may be textured with a texturing solution such as potassium hydroxide (KOH) and isopropyl alcohol (IPA) or KOH and a short chain alcohol such at butanol at room temperature for a time sufficient to produce a textured silicon surface capable of trapping light within the solar cell to maximize the efficiency of the solar cell. The texturing solution may be varied to combinatorially test different texturing solutions. The texturing solution may be varied by varying the chemical components, the concentrations of those components, or by varying any of the process conditions such as time and temperature. The texturing process may be performed after etching the frontside diffusion barrier 202 without removing the crystalline silicon substrate 200 from the wet processing tool 300. Performing both the diffusion barrier etching process 103 and the silicon etching process 104 in the same tool may allow for high throughput combinatorial processing of the crystalline silicon substrate. The use of the wet processing tool 300 to form the site-isolation for combinatorial purposes as well as for forming the areas of each of the individual solar cells also increases the efficiency of the combinatorial methodology.

At block 105 of the flow chart of FIG. 1 the crystalline substrate may be cleaned. The cleaning process may be performed using the combinatorial wet processing tool 300, which means that the crystalline silicon substrate 200 would remain in the tool after the texturing at block 104. In an embodiment, the cleaning solutions may be varied combinatorially if the cleaning is performed in the wet processing tool 300. Alternatively, the cleaning may be performed over the entire surface of the substrate after removing the crystalline silicon substrate 200 from the combinatorial wet processing tool 300 as shown in FIG. 2D. Cleaning the entire substrate could be performed in a bath by immersion, by spraying, or a dispense of the cleaning solution. The cleaning process may be performed to remove any residues or metal contaminants from the substrate 200. The cleaning solution used may be for example a dilute hydrofluoric acid solution, an RCA clean, or a piranha clean (sulfuric acid and hydrogen peroxide.) The cleaning is optional but may improve the performance of the solar cells formed by this methodology.

At block 106 the site-isolated regions of the crystalline silicon substrate are n-doped. As illustrated in FIG. 2E the doping is self-aligned because of the etch pattern formed in the frontside diffusion barrier 202. In the process illustrated in FIGS. 2E and 2F the phosphor n-dopant is diffused into the exposed crystalline silicon substrate from a gas in a furnace. In this process, nitrogen ($N_2$) gas is bubbled through a liquid dopant ($POCl_3$) in a quartz furnace. In this embodiment, the crystalline silicon substrate 200 may be placed vertically in a boat with other substrates and heated in the furnace to a temperature in the approximate range of 900° C. to 950° C. for approximately 5 to 10 minutes while the dopant gas is flowed into the furnace. The diffusion barriers 202 and 204 prevent diffusion of the dopant into areas other than the site-isolated exposed regions of the textured crystalline silicon substrate. A doped layer of textured crystalline silicon 214 is formed as shown in FIG. 2F.

In an alternate embodiment, the crystalline silicon substrate may be doped within the combinatorial wet processing tool 300 where the dopant is diffused from a liquid solution. In this embodiment, multiple processes of the crystalline silicon substrate 200 could be processed in the combinatorial wet processing tool: the etching of the diffusion barrier 202 at block 103, the texturing of the crystalline silicon substrate 200 at block 104, the optional cleaning process at block 105, and the n-doping of the crystalline silicon substrate 200 at block 106. The liquid dopant solution could be combinatorially varied if applied in the combinatorial wet processing tool 300. The liquid dopant solution contains phosphor for the doping and in one embodiment may be a solution of a solvent and $POCl_3$. Alternately the phosphor n-dopant may be applied as a $POCl_3$ paste that can be screen printed or spun onto the frontside of the crystalline silicon substrate 200 and then dried. After drying of the liquid or the paste the substrate 200 is placed in a furnace to diffuse the dopant into the crystalline silicon substrate. The patterned frontside diffusion barrier 202 and the backside diffusion barrier 204 ensure that the dopant only diffuses into the exposed surface of the crystalline silicon substrate 200 in the site-isolated textured regions 210 to form the doped region 214. The substrate 200 is then placed in a furnace to diffuse the phosphor into the textured exposed regions 210 to form the doped regions 214 as illustrated in FIG. 2F. In one embodiment the furnace may be a belt furnace where the substrate 200 is placed on a conveyor belt and passed to the furnace to perform the n-dopant diffusion from the dried liquid or paste on the surface of the substrate 200. In one example, the belt furnace may have a temperature of approximately 600° C. and clean air as the substrate 200 enters the furnace on the conveyor belt to burn off any organic contaminants before ramping up to approximately 950° C. in nitrogen ambient for about 15 minutes for the actual doping.

At block 107 a passivation layer 216 is formed over the doped site-isolated regions 214 and over the patterned frontside diffusion barrier layer 202, as illustrated in FIG. 2G. The passivation layer may be any insulating material such as silicon dioxide ($SiO_2$) or hydrogenated silicon nitride ($SiN_2$). In one embodiment, the passivation layer may be an anti-reflective coating (ARC) or a transparent protective layer for the solar cells. The passivation layer 216 may be deposited with PECVD, PVD, or ALD. The passivation layer may be combinatorially varied in a combinatorial CVD, PVD, or ALD tool.

At FIG. 2H further isolation of the site-isolated solar cells by scribing may be accomplished by a laser or a dicer. Additional isolation is optional and may be selected depending on the processes used to build the solar cell. For example, scribing may be used if the diffusion of the dopant extends under the diffusion barrier areas between the separate the site-isolated textured regions of the crystalline silicon substrate.

At block 108 of the flowchart in FIG. 1 electrical contacts are formed to complete the formation of the individual solar cells in each of the site-isolated regions 210 of the crystalline silicon substrate 200. The formation of the electrical contacts by metallization on the frontside and backside of the crystalline silicon substrate 200 is illustrated in FIGS. 2I though 2P. In FIG. 2I dots of etch paste 220 are dispensed onto the approximate center of each of the site-isolated regions 210. The etch paste 220 is a material that is capable of etching the passivation layers 16 when heated and includes a conductive component to form electrical contact with the crystalline silicon 200. FIG. 2I is the side-view showing how the dots of etch paste 220 sit above the passivation layers 216. FIG. 2J shows how each of the dots of etch paste 220 is in the approximate center of each of the site isolated regions 210. At FIG. 2K the substrate 200 along with the etch paste 220 is heated to cause the dots of etch paste 220 on each of the site isolated regions 210 to etch through the passivation layer 216, which may be formed of an insulating material, and form electrical contact with the crystalline silicon. FIG. 2L shows a side-view of this process. The etch paste 220 may be combinatorially evaluated by, for example, varying the type of paste used or by varying the temperature of the firing step. At FIG. 2M a conductive material is deposited to form electrical lines 222 to the edges of the crystalline silicon substrate 200 to form convenient contact points 224. In an embodiment the conductive material may be silver (Ag). The electrical lines 222 and contact points 224 may be printed by screen printing, by ink jet printing, or alternatively by PVD through a shadowmask. The backside contacts can be formed using the same methodology used for forming the frontside contacts. FIGS. 2N and 2O illustrate the side view and the bottom view, respectively, of the backside contacts. At FIG. 2P each of the solar cells 230 formed on the crystalline silicon substrate 200 may be electrically tested and evaluated to compare their performance for combinatorial screening purposes.

Similar methods to those described above may be used to build alternative solar cells such as selective emitter solar cells or all-back contact solar cells. An all-back contact solar cell is metalized only on the backside of the substrate to maximize the amount of sunlight that penetrates the crystalline silicon solar cells because there are no longer any shadows on the frontside created by frontside metallization. Referring to the Flowchart in FIG. 1, the same processes as described above in blocks 101-107 and in FIGS. 2A-2G may be used to form the all-back contact solar cells on a combinatorial test substrate. The main difference is in how the electrical contacts are formed on the site-isolated regions of the crystalline silicon substrate at block 108 of the flowchart in FIG. 1.

Figures 1, 4A:
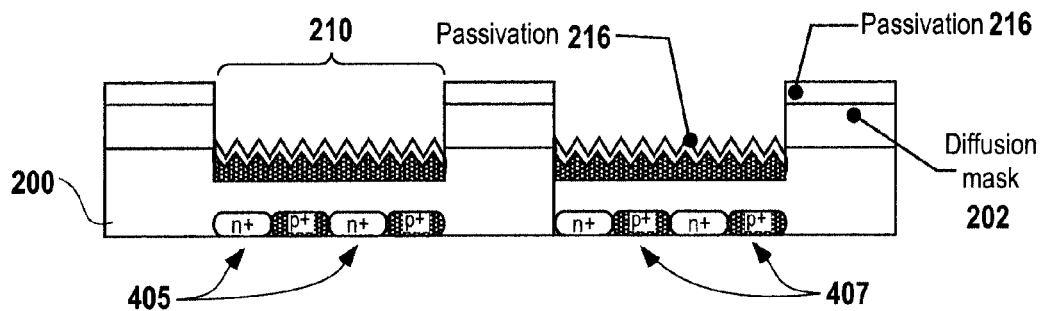
Figures 2, 4A:
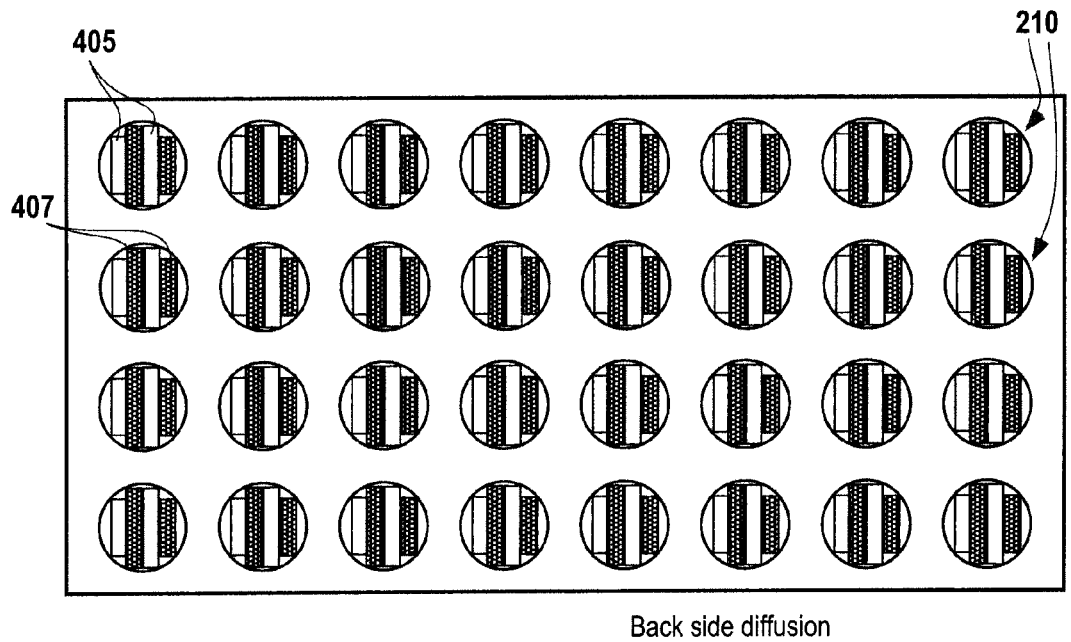

FIG. 4A-1 illustrates a combinatorial crystalline silicon test substrate 200 after the frontside passivation process of block 107 of the flowchart in FIG. 1 and after the formation of alternating n-doped regions 405 and p-doped regions 407 on the backside of each of the site-isolated solar cell areas 210. To form the backside doped regions, the diffusion mask 204 as formed in process 101 of the flowchart in FIG. 1, is either removed from the backside prior to the backside doping or simply not formed. These alternating n-doped regions 405 and p-doped regions 407 may be formed through the use of photolithography to mask areas of the substrate during each of the doping processes. The doping for each of the n-doped regions 405 may be done as described above in relation to process 106 of FIG. 1, using either a liquid, a paste, or a gaseous dopant followed by a heat diffusion step. A similar process, except using p-dopants, would be performed to create the p-doped regions 407. FIG. 4A-1 illustrates a side-view of two exemplary solar cell regions 210 with the alternating doped regions 405 and 407 and FIG. 4A-2 illustrates a top-down view of the backside of the substrate 200 having the alternating doped regions 405 and 407 on each of the site-isolated solar cell areas. After the doping is completed the substrate may be cleaned to remove any residue or phosphosilicate glass that forms during the doping process.

Figure 4B:
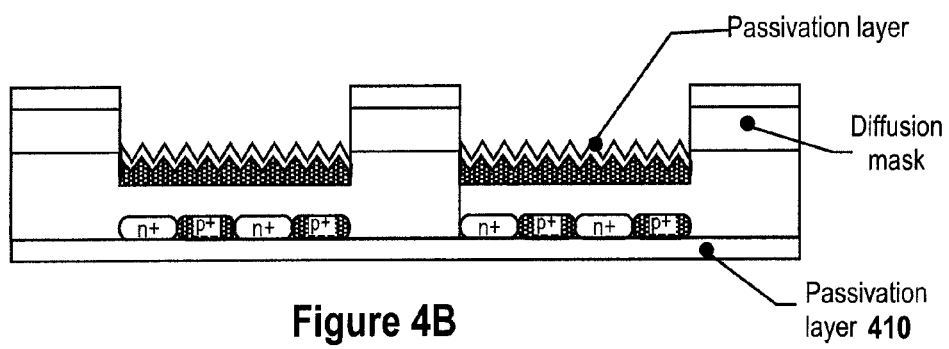

In FIG. 4B a passivation layer 410 may be deposited on the backside of the crystalline silicon substrate 200. The passivation layer 410 may be any insulating material such as silicon nitride or silicon dioxide. In one embodiment the passivation layer 410 may be PECVD deposited silicon nitride. FIG. 4C illustrates the top-down view of the backside of the substrate 200 after deposition of the passivation layer 410 over the alternating doped areas.

In FIG. 4D contact holes 412 are etched through the passivation layer 410 on the backside of the crystalline silicon substrate 200. Contact holes 412 are etched to form contact with each of the n-doped regions 405 and the p-doped regions 407. Photolithography techniques may be used to form a mask that covers the backside areas that are not etched. The etchant may be a liquid solution capable of etching the passivation layer but not etching the underlying doped regions of the crystalline silicon substrate 200. Alternatively a plasma etch may be used. After removing the photoresist the backside of the substrate 200 may look like FIG. 4E which illustrates a top-down view. In FIG. 4E, for example, each of the n-doped regions 405 and the p-doped regions 407 has two contact holes, although any number of contact holes to the doped regions may be created.

FIGS. 4F and 4G illustrate the substrate 200 after forming the contacts through metallization. First metal lines 414 are formed over the n-doped regions 405 and second metal lines 416 are formed over the p-doped regions 407 creating two test pads 424 and 426 for each of the solar cells 230. By connecting electrical leads to each of the test pads the electrical performance of each of the solar cells 230 may be tested and combinatorially evaluated.

Selective emitter crystalline silicon solar cells may also be formed and evaluated combinatorially using the methodology outlined in the flowchart of FIG. 1.

Selective emitter refers to a type of crystalline silicon solar cell where the crystalline silicon substrate is more highly doped under the regions where contacts are formed on the frontside of the solar cell. This is to reduce recombination of electrons within the crystalline silicon solar cells and therefore potentially improve the efficiency of the solar cells. In general, selective emitter solar cells are formed by a two-step doping process where first a light doping region is formed followed by the formation of a more heavily doped region.

In one embodiment, the processes of the flowchart in FIG. 1 from 101 to 105 as described above in relation to FIGS. 2A-2D may be the same as those for the formation of a conventional type crystalline silicon solar cell. At block 106 of the flowchart in FIG. 1, the site-isolated regions 210 of the crystalline silicon substrate 200 are n-doped. For a selective emitter solar cell this n-doping at block 106 may be done through alternate methods.

Figures 1, 5A:
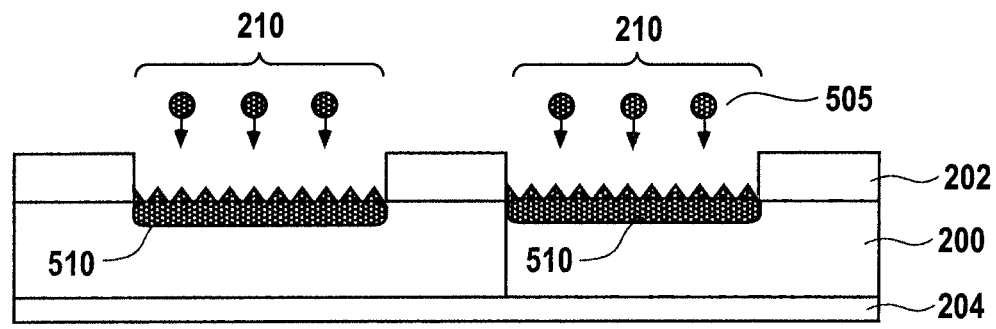
FIGS. 5A-5C illustrate an alternative process for forming the crystalline silicon solar cell substrate containing selective emitter solar cells.
Figures 2, 5A:
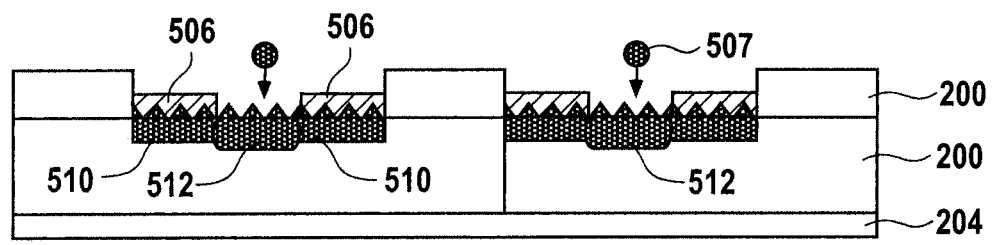
Figures 3, 5A:
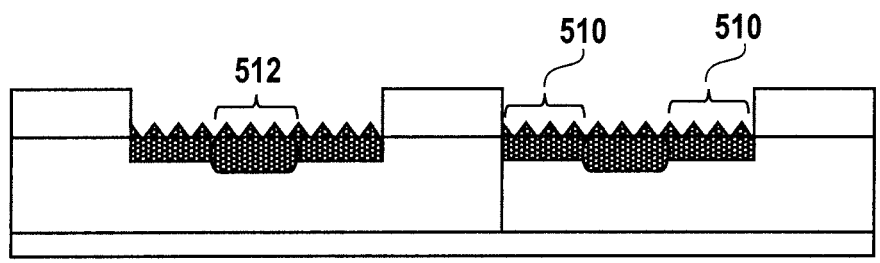

In one particular embodiment FIGS. 5A-1 through 5A-3 illustrate one method of forming both the lightly doped regions and heavily doped regions of a selective emitter solar cell. In FIG. 5A-1 the site-isolated regions 210 of the crystalline silicon substrate 200 are lightly doped with an n-dopant 505, such as phosphor, to form the lightly doped regions 510. As described earlier, the n-dopant may be applied as a liquid, paste, or gas and then fired in a furnace to diffuse the dopant into the substrate 200 in the regions that are not protected by the diffusion barriers 202 (frontside) and 204 (backside.) The lightly doped areas 510 may be doped to have a sheet resistance of approximately 70-100 ohms/square. In FIG. 5A-2 the crystalline silicon substrate is more heavily doped to form the heavily doped areas 512. To perform the heavy doping another doping process is performed over the site-isolated regions 210 in the area where the metallization will ultimately be formed. The more heavily doped areas 512 are formed by first forming a photoresist mask over the substrate in the portions 506 of the site isolated regions 210 to prevent dopant 507 from diffusing into the lightly doped regions 510. The dopant 507 is then exposed to the substrate to diffuse into the unmasked portions within the site-isolated regions 210 to form the heavily doped areas 512. The heavily doped areas 512 are doped to an extent sufficient to have a sheet resistance of approximately 20-30 ohms/square. The photoresist mask 506 is then removed completely as illustrated in FIG. 5A-3 and the substrate is placed within a furnace to diffuse the dopant 507 into the heavily doped areas 512. The selective emitter solar cells may then be completed to form the combinatorially processed test substrate by any of the methods described above for blocks 107 and 108.

Figures 1, 5B:
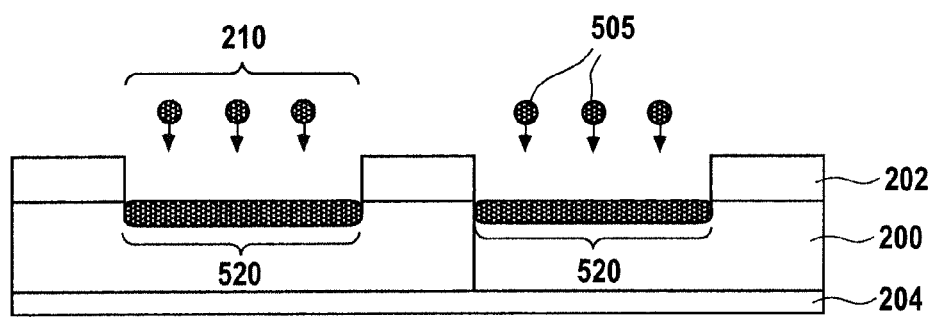
Figures 2, 5B:
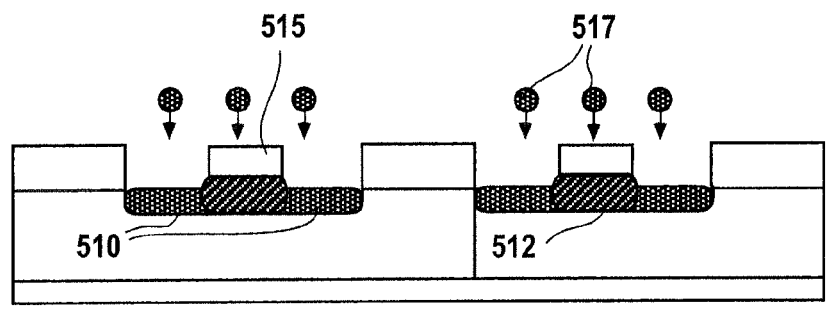
Figures 1, 5C:
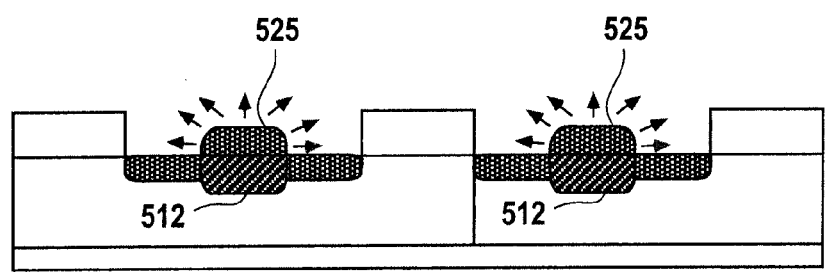
Figures 2, 5C:
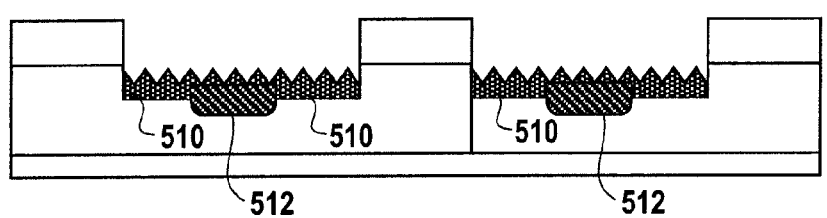

In an alternate embodiment, FIGS. 5B-1 through 5B-3 illustrate another method of forming both the lightly doped regions and heavily doped regions of a selective emitter solar cell by the use of an additional etching step. In this embodiment the texturing of the regions of crystalline silicon at block 104 is performed after the doping step. The site-isolated regions 210 of FIG. 5B-1 are exposed to a liquid or gaseous dopant 505 to form the lightly doped regions 510. In FIG. 5B-2 a patterned mask 515, such a photoresist, has been formed over the center regions 512 of the site-isolated regions 210 by conventional methods known to those of skill in the art. An etchant 517 is then applied to the substrate to etch the lightly doped areas 510. The areas are etched to an extent sufficient to tune the sheet resistance in the lightly doped areas 510 to approximately 70-100 ohms/square. A dopant paste 525 is then patterned on the substrate 200 in the site-isolated regions 210 as shown in FIG. 5C-1 followed by exposure to heat in a furnace to diffuse more dopants into the highly doped areas 512. The dopant paste 525 is then removed and the surface of the exposed silicon substrate 200 in the site-isolated regions 210 are textured according methods described above in FIG. 5C-2. The texturing may be combinatorially varied using a wet combinatorial processing tool as described above. The solar cell test substrate may then be completed by forming a passivation layer over the site-isolated regions of the crystalline silicon substrate at block 107 using any of the methods described above. Electrical contacts may then be formed at block 108 using any of the methods described above or by forming buried contacts using methods known to those of skill in the art.

After a crystalline silicon solar cell test substrate is formed according to any of the methods described, the combinatorially varied solar cells are characterized. The characterization may be performed by measuring the electrical performance of each of the varied solar cells on the test substrate. For example, the current vs. the voltage of each of the cells can be measured or the quantum efficiency of the cell may be determined. The varied solar cells having the best performance may then be identified and tested on another test substrate or scaled up to manufacturing.

Figure 6:
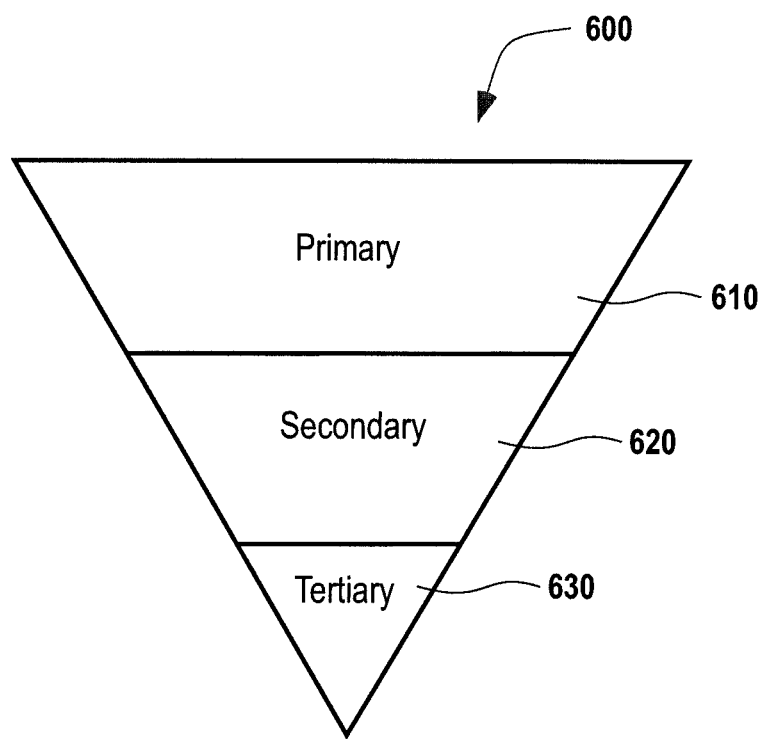
FIG. 6 illustrates a diagram of a combinatorial screening flow according to one embodiment of the invention.

Combinatorial processing may include any processing that varies the processing in two or more regions of a substrate. The combinatorial methodology, in embodiments of the current invention, may include multiple levels of screening to identify, for example, materials, process conditions, process ordering, or process integration for further variation and optimization. FIG. 6 illustrates a diagram 600 showing three levels of screening for the development of the crystalline silicon solar cells using combinatorial methodologies. The diagram 600 shows a funnel, where the primary screening 610 includes the largest number of samples of texturing solutions funneling down to the secondary screening 620 and the tertiary screening 630 where the least number of samples of the texturing solutions are tested. The number of samples used at any of the screening levels may be dependent on the substrate or tools used to process the samples.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of forming a crystalline silicon solar cell test substrate, comprising:
    depositing a diffusion barrier material onto a frontside and a backside of a crystalline silicon substrate;
    placing the crystalline silicon substrate in a combinatorial wet processing tool to process a plurality of site-isolated regions with the following processes:
        etching the diffusion barrier from the frontside of the substrate in the plurality of site-isolated regions to expose regions of crystalline silicon;
        texturing the regions of crystalline silicon using a texturing solution to form a plurality of textured regions;
        cleaning the plurality of textured regions;

applying a first dopant as a liquid, paste, or gas to the plurality of textured regions;

firing the substrate in a first furnace step, wherein a portion of the first dopant diffuses into each of the textured regions;

forming a photoresist mask over a portion of each of the site-isolated regions;

exposing the unmasked portions of each of the site-isolated regions to a second dopant;

firing the substrate in a second furnace step, wherein a portion of the second dopant diffuses into each of the site-isolated regions; and removing the photoresist mask.

2. The method of claim 1, wherein at least one of the etching, texturing, or cleaning step are varied in a combinatorial manner between at least two of the site-isolated regions.

3. The method of claim 1, wherein the textured regions have a sheet resistance of approximately 70 to 100 ohms/square after the first furnace step.

4. The method of claim 1, wherein the unmasked portions of each of the site-isolated regions exposed to the second dopant have a sheet resistance of approximately 20 to 30 ohms/square after the second furnace step.

5. The method of claim 1, wherein the first dopant is varied in at least two of the site-isolated regions.

6. The method of claim 1, wherein the second dopant is varied in at least two of the site-isolated regions.

7. The method of claim 1, wherein cleaning the plurality of textured regions occurs in the combinatorial wet processing tool and a cleaning solution is varied in at least two of the site-isolated regions.

8. The method of claim 7, wherein cleaning the plurality of textured regions occurs globally over the frontside of the substrate.

9. The method of claim 1, further comprising forming a passivation layer over the site-isolated regions.

10. The method of claim 9, further comprising forming electrical contacts on the site-isolated regions.

11. The method of claim 10, wherein forming the electrical contacts on the site-isolated regions comprises forming frontside and backside contacts.

12. The method of claim 1 wherein the diffusion barrier is one of silicon nitride or silicon dioxide.

13. The method of claim 1 wherein the diffusion barrier is deposited by one of PECVD, LPCVD, PVD, or a sol-gel method.

14. The method of claim 1 wherein etching the diffusion barrier uses an etchant comprising one of HF or $H_2PO_3$.

15. The method of claim 1 wherein the texturing solution is varied in at least two of the site-isolated regions.

16. The method of claim 15 wherein the texturing solution is varied by varying the chemical components, the concentrations of those components, or by varying process conditions such as time and temperature.

\* \* \* \* \*